(12) United States Patent
Shin et al.

(10) Patent No.: US 12,009,035 B2
(45) Date of Patent: Jun. 11, 2024

(54) APPARATUS FOR CONTROLLING NAND FLASH MEMORY DEVICE AND METHOD FOR CONTROLLING SAME

(71) Applicant: LG INNOTEK CO., LTD., Seoul (KR)

(72) Inventors: Sang Hoon Shin, Seoul (KR); Hyoung Ki Nam, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 119 days.

(21) Appl. No.: 17/766,028

(22) PCT Filed: Oct. 5, 2020

(86) PCT No.: PCT/KR2020/013497
§ 371 (c)(1),
(2) Date: Apr. 1, 2022

(87) PCT Pub. No.: WO2021/066620
PCT Pub. Date: Apr. 8, 2021

(65) Prior Publication Data
US 2022/0343983 A1   Oct. 27, 2022

(30) Foreign Application Priority Data

Oct. 4, 2019 (KR) .................. 10-2019-0123136

(51) Int. Cl.
G11C 16/04  (2006.01)
G11C 16/14  (2006.01)
G11C 16/30  (2006.01)

(52) U.S. Cl.
CPC .......... *G11C 16/30* (2013.01); *G11C 16/0483* (2013.01); *G11C 16/14* (2013.01)

(58) Field of Classification Search
CPC ..... G11C 16/30; G11C 16/0483; G11C 16/14; G11C 16/10; G11C 5/14; Y02D 10/00
(Continued)

(56) References Cited

U.S. PATENT DOCUMENTS 5,283,905 A    2/1994  Saadeh et al.
6,862,651 B2   3/2005  Beckert et al.
(Continued)

FOREIGN PATENT DOCUMENTS

JP    2009-301124 A    12/2009
JP    2017-037497 A    2/2017
(Continued)

*Primary Examiner* — Tha-O H Bui
(74) *Attorney, Agent, or Firm* — Birch, Stewart, Kolasch & Birch, LLP

(57) ABSTRACT

A control apparatus for a NAND flash memory device according to an embodiment includes a NAND flash memory; a controller configured to generate a command signal to program, read, and erase data in the NAND flash memory; and an auxiliary power circuit configured to maintain power for operating the memory and the controller during a first time from a first time point when a voltage of a supply power is less than a preset voltage, wherein the controller is configured to block the command signal during the first time, and wherein power supplied to the memory is blocked for at least a second time from a second time point after the first time.

20 Claims, 12 Drawing Sheets

(58) Field of Classification Search
USPC .................................................. 365/185.17
See application file for complete search history.

(56) References Cited

U.S. PATENT DOCUMENTS

| | | | |
|---|---|---|---|
| 7,107,480 B1* | 9/2006 | Moshayedi | G06F 11/1441 |
| | | | 714/E11.138 |
| 7,774,390 B2 | 8/2010 | Shin | |
| 7,882,375 B2* | 2/2011 | Yoon | G11C 16/30 |
| | | | 713/340 |
| 8,605,533 B2 | 12/2013 | Seo | |
| 9,484,069 B2 | 11/2016 | Shim et al. | |
| 10,672,434 B2 | 6/2020 | Choi | |
| 10,679,701 B2 | 6/2020 | Park et al. | |
| 11,112,997 B2* | 9/2021 | Kim | G06F 3/0679 |

FOREIGN PATENT DOCUMENTS

| | | |
|---|---|---|
| KR | 10-0725410 B1 | 6/2007 |
| KR | 10-2011-0059558 A | 6/2011 |
| KR | 10-2015-0141239 A | 12/2015 |
| KR | 10-2017-0056936 A | 5/2017 |
| KR | 10-2019-0100780 A | 8/2019 |

* cited by examiner (a)

(b)

(a)

(b)

APPARATUS FOR CONTROLLING NAND FLASH MEMORY DEVICE AND METHOD FOR CONTROLLING SAME

CROSS REFERENCE TO RELATED APPLICATIONS

This application is the National Phase of PCT International Application No. PCT/KR2020/013497, filed on Oct. 5, 2020, which claims priority under 35 U.S.C. 119(a) to Patent Application No. 10-2019-0123136, filed in Korea on Oct. 4, 2019, all of which are hereby expressly incorporated by reference into the present application.

TECHNICAL FIELD

An embodiment relates to an apparatus for controlling a NAND flash memory device, and more particularly, to an apparatus for controlling a NAND flash memory device capable of preventing data corruption occurring in an unstable power environment such as sudden power loss, and a method for controlling the same.

BACKGROUND ART

Recently, there is an increasing demand for nonvolatile memory devices that can be electrically programmed and erased and do not require a refresh function that rewrites data at regular intervals. Further, research on high-integration technology of the memory device is being actively conducted in order to develop a large-capacity memory device capable of storing a large amount of data. Here, 'program' means an operation of writing data in a memory cell, and 'erase' means an operation of removing data written in the memory cell.

As a result, a NAND flash memory device in which a plurality of memory cells are connected in series (that is, a structure in which adjacent cells share a drain or source with each other) to form one string has been proposed for high integration of the nonvolatile memory device. The NAND flash memory device is a memory device that sequentially reads information, unlike a NOR type flash memory device, and program and erase operations of the NAND flash memory device are performed by injecting or emitting electrons to a floating gate using a Fowler-Nordheim (FN) tunneling method to control a threshold voltage of the memory cell.

Accordingly, the erased cell has a negative threshold voltage due to the emission of electrons from the floating gate, a phase (state) of the erased cell is called on-cell. And, the programmed cell has a positive threshold voltage by injecting electrons in the floating gate, and a phase of the programmed cell is called off-cell.

Meanwhile, recently, wireless communication and Global Positioning System (GPS) technology are combined, and telematics for providing various mobile communication services such as location information, safe driving, entertainment, financial services, reservations and product purchases in automobiles is being applied. In addition, the telematics is provided with the NAND flash memory device as described above, and accordingly, data generated during driving is programmed in real time.

In addition, a safety-related eCall function in telematics automatically attempts to connect a call to 112, Europe's single emergency number, in an event of a serious accident. At this time, if a driver is unconscious or unable to make a direct call, the eCall function will automatically provide the vehicle's location, type, color and number of passengers to an emergency service center. Most countries are building an emergency service system that operates in the event of a vehicle accident similar to eCall, and this function requires high reliability as it relates to human life.

However, the NAND flash memory device applied to telematics as described above has a problem in that data corruption such as charge gain occurs in an unstable power supply state. In other words, NAND flash memory devices applied to telematics products have fundamental weaknesses in reliability, such as intermittent failure of data corruption during power interruption due to charge gain, which is a structural weakness, and due to this, there is a problem that the eCall function cannot be performed normally.

DISCLOSURE

Technical Problem

An embodiment provides an apparatus for controlling a NAND flash memory device capable of fundamentally resolving data corruption due to a charge gain that occurs when power is interrupted, and a method for controlling the same.

In addition, the embodiment provides an apparatus for controlling a NAND flash memory device and a method for controlling the same, which can solve problems that may occur when the memory operates at the time of power interruption by blocking access to the memory when power supply interruption is detected.

In addition, the embodiment provides an apparatus for controlling a NAND flash memory device capable of solving data corruption caused by a charge gain when power is blocked during a program operation or an erase operation of the NAND flash, by supplying auxiliary power until an ongoing operation is completed when the NAND flash operation is in progress at the time of power interruption detection, and a method for controlling the same.

In addition, an embodiment provides a control apparatus for a NAND flash memory device and a method for controlling the same, which allow the flash memory to operate normally when the power is restored, by performing a power-off sequence of the flash memory when power supply interruption is detected, and performing a power-on sequence when a normal power supply is detected, The technical problem to be solved in the embodiment is not limited to the technical problem mentioned above, and another technical problem not mentioned will be clearly understood by those of ordinary skill in the art to which the present invention belongs from the following description.

Technical Solution

A control apparatus for a NAND flash memory device according to an embodiment includes a NAND flash memory; a controller configured to generate a command signal to program, read, and erase data in the NAND flash memory; and an auxiliary power circuit configured to maintain power for operating the memory and the controller during a first time from a first time point when a voltage of a supply power is less than a preset voltage, wherein the controller is configured to block the command signal during the first time, and wherein power supplied to the memory is blocked for at least a second time from a second time point after the first time.

In addition, when the first time point is a program operation time (tPROG) or an erase operation time (tBERS)

of the memory, the auxiliary power circuit supplies auxiliary power for completing the program operation or erase operation of the memory.

In addition, the first time is a time until a program operation or an erase operation being performed in the memory before the first time point is completed.

In addition, the control apparatus further includes a power management IC (PMIC) connected to the supply power and supplying power to the memory and the controller.

In addition, the auxiliary power circuit is disposed between the PMIC and the memory.

In addition, the controller is configured to control the PMIC so that power is supplied to the memory after the power supply is blocked for the at least second time.

In addition, the control apparatus further includes an input voltage detector configured to detect a voltage level of the supply power, and the auxiliary power circuit is connected to a power input terminal of the PMIC.

In addition, the input voltage detector is configured to detect a voltage level of an input terminal of the auxiliary power circuit.

Advantageous Effects

The embodiment detects an unstable state of the input power and controls the operation of the NAND flash memory device based on this, and accordingly, it is possible to prevent defects such as data corruption that may occur when the NAND flash memory device operates in an unstable state of the input power. Specifically, according to the embodiment, the flash access is blocked when the input power is unstable, and accordingly, it is possible to prevent malfunction of the NAND flash memory device in an unstable environment of the input power.

In addition, when the operation of the NAND flash memory device in the embodiment is in progress at the time of power interruption detection, auxiliary power is supplied until the ongoing operation is completed, and accordingly, it is possible to solve data corruption due to charge gain that occurs when power is blocked during a program operation or an erase operation of the NAND flash memory device. Accordingly, the operation reliability of the NAND flash memory device may be improved.

In addition, a power-off sequence of the NAND flash memory device in the embodiment is performed when a power supply interruption is detected, and a power-on sequence is performed when a normal power supply is detected, and accordingly, operation reliability and user satisfaction can be improved as the flash memory normally operates when the input power is restored.

DETAILED DESCRIPTION OF THE EMBODIMENTS

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used.

These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Figure 1:
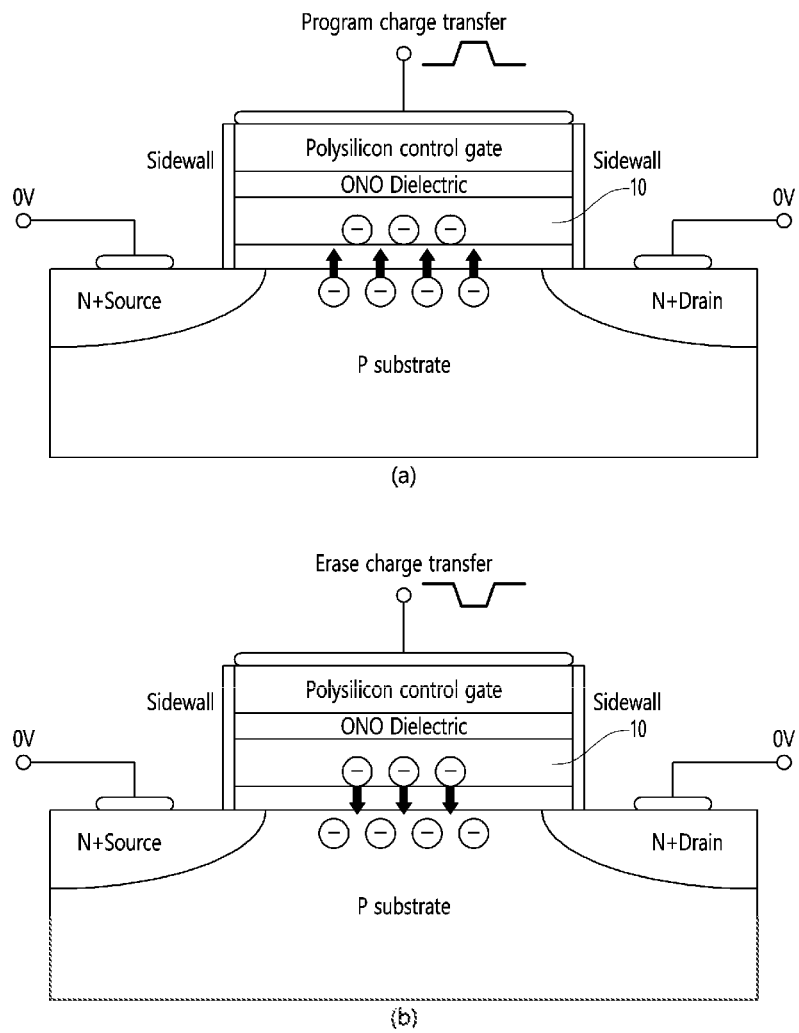
FIG. 1 is a view for explaining a structure of a memory cell of a NAND flash memory device.

FIG. 1 is a view for explaining a structure of a memory cell of a NAND flash memory device.

Referring to FIG. 1, an operation of a NAND flash memory device consists of three operations including erase, program, and read.

A program operation of the NAND flash memory device is performed in page units.

In the program operation, electrons are moved in the direction of a floating gate (FG) 10 by applying a constant voltage (eg, 19V) to a control gate (CG) of a memory cell. At this time, a state of the memory cell becomes OFF TR or OFF cell state and becomes a positive (+) threshold voltage Vt. In this case, the program operation of the flash memory device may not be completed once, but may be performed over a plurality of steps, and desired data may be programmed by increasing the voltage applied to the control gate.

In addition, the erase operation of the NAND flash memory device is performed in block units, and may mean changing a cell from 0 to 1.

At this time, when a certain voltage (eg, 20V) is applied from the P substrate in order to perform the erase operation of the NAND flash memory device, electrons in the floating gate 10 of the memory cell are moved downward by a F-N tuning effect. In addition, the erased memory cell may have a negative (−) threshold voltage Vt due to the emission of electrons from the floating gate 10. In this case, the state of the erased memory cell may be referred to as an ON TR or ON cell state.

In addition, the read operation of the NAND flash memory device refers to an operation of outputting data as 1 or 0 by checking whether the state of the memory cell is On TR or Off TR.

Figure 2:
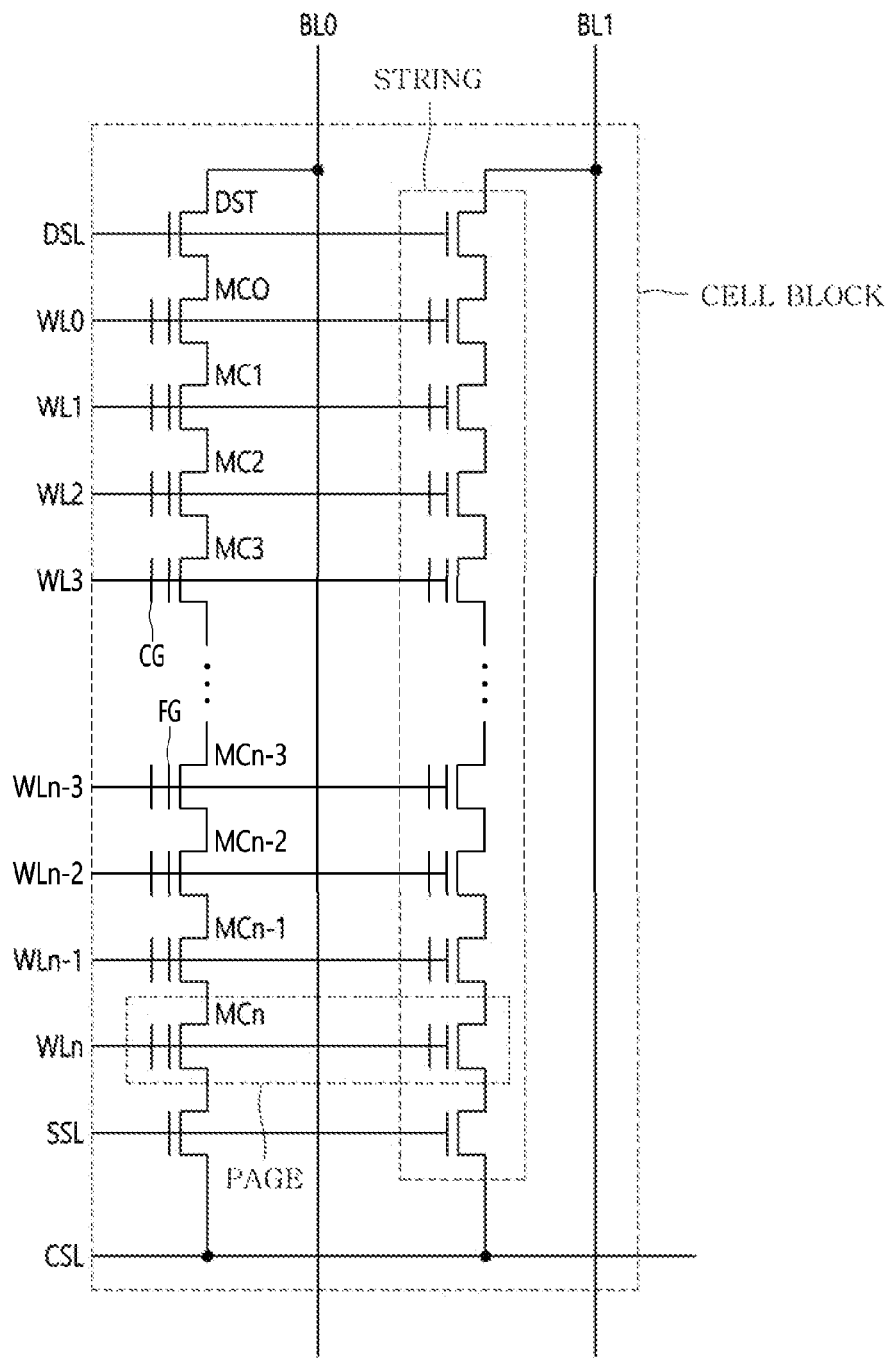
FIG. 2 is an equivalent circuit diagram illustrating a memory cell array of FIG. 1.

FIG. 2 is an equivalent circuit diagram illustrating a memory cell array of FIG. 1.

Referring to FIG. 2, a memory cell array of a NAND flash memory device includes a plurality of blocks. In addition, a plurality of bit lines BL0 to BLn are arranged in parallel in each of the plurality of blocks.

In addition, a plurality of strings corresponding to each of the plurality of bit lines BL0 to BLn are disposed in each of the plurality of blocks. Each of the plurality of strings may include a drain select transistor (DST) and a source select transistor (SST) for selecting the corresponding string. In addition, a plurality of memory cells MC0 to MCn (herein, n may be 15, 31, or 63) are connected in series between the drain select transistor DST and the source select transistor SST. In addition, a source of the source select transistor SST of each of the plurality of strings is commonly connected to a common source line (CSL).

Also, a gate of the drain select transistor DST configured in the plurality of strings is connected to a drain select line (DSL), and a gate of the source select transistor SST is connected to a source select line (SSL). In addition, a control gate (CG) of each of the memory cells MC0 to MCn is connected to word lines WL0 to WLn.

The NAND flash memory device having the memory cell array configured as described above performs read and program operations in page units and erase operation in block units. Here, the page unit includes all memory cells to which a control gate is commonly connected to one word line.

Figure 3:
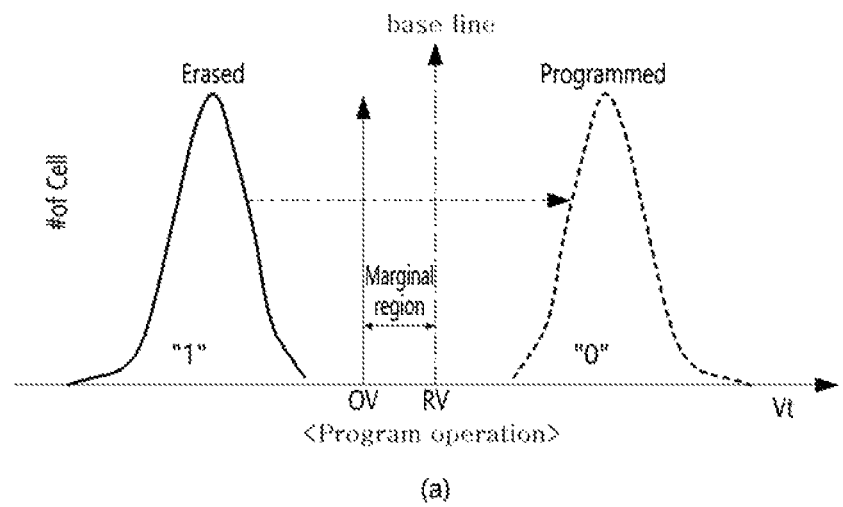
FIG. 3 is a view schematically illustrating program and erase operations of a NAND flash memory device.
Figure 3:
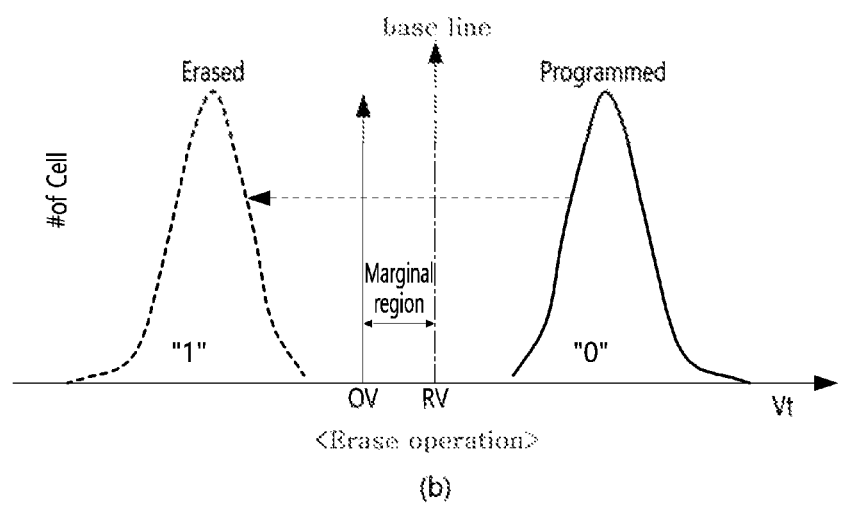

FIG. 3 is a view schematically illustrating program and erase operations of a NAND flash memory device.

Referring to FIG. 3, programming and erasing operations of a NAND flash memory device mean changing a state of a memory cell from '0' to '1' or from '1' to '0'.

As shown in FIG. 2, the floating gate FG is positioned between the control gate CG and the P substrate. Here, the floating gate FG is insulated from the control gate CG or the P substrate by an oxide layer, whereby electrons located therein are trapped. In this case, when the electrons are in the floating gate FG, the threshold voltage Vt of the memory cell may be changed by affecting the electric field emitted from the control gate CG. That is, the threshold voltage Vt of the memory cell may be changed to a positive (+) value (+Vt) or a negative (−Vt) value depending on the number of electrons present in the floating gate FG based on 0V.

When information of the memory cell is read by applying a specific voltage to the control gate CG as described above, the threshold voltage Vt varies according to the number of electrons in the floating gate FG, whereby current flows or does not flow. It is read whether the current flows or not, which can be interpreted as data '1' and '0'. In addition, a multi-level cell (MLC) device in which one or more bits of information is stored in one memory cell reads the amount rather than simply determining the flow of current in order to measure the number of electrons stored in the floating FG.

Referring to FIG. 3(a), a predetermined voltage (eg, 19V) is applied to a control gate of a memory cell in a program operation of a NAND flash memory device, so that electrons move in the direction of the floating gate 10. At this time, the state of the memory cell becomes the OFF TR state to have a positive (+) threshold voltage Vt.

That is, as shown in FIG. 3(a), when a predetermined voltage is applied to the control gate CG, electrons move to the floating gate 10, and the threshold voltage Vt of the corresponding memory cell may increase to be greater than or equal to the reference threshold voltage RV by increasing the number of moving electrons. Also, when the threshold voltage Vt of the memory cell increases to be greater than or equal to a reference threshold voltage RV, the state of the memory cell may be changed from '1' to '0'. Here, the reference threshold voltage RV may be set to various values according to memory specifications, for example, may be set to a specific value greater than 0V.

Also, referring to FIG. 3(b), when a constant voltage (eg, 20V) is applied from the P substrate in the erase operation of the NAND flash memory device, electrons in the floating gate 10 of the memory cell are moved downward by the F-N tuning effect.

That is, the number of electrons in the floating gate is reduced in the erase operation as shown in FIG. 3(b), and for this reason, the threshold voltage (Vt) of a corresponding memory cell may decrease. In addition, when the threshold voltage Vt of the memory cell decreases to less than the reference threshold voltage RV, the state of the corresponding memory cell may be changed from '0' to '1'.

As described above, the program operation and the erase operation of the NAND flash memory device may be divided based on a reference threshold voltage RV of the memory cell that changes depending on the number of charges present in the floating gate 10, as shown in FIGS. 3(a) and (b). That is, when the threshold voltage Vt of the memory cell is equal to or greater than the reference threshold voltage RV, the NAND flash memory device recognizes it as '0' and performs a program operation. Also, when the threshold voltage Vt of the memory cell is less than the reference threshold voltage RV, the NAND flash memory device recognizes it as '1' and performs an erase operation.

However, when a power instability condition (eg, instantaneous power interruption) occurs in the process of moving electrons according to the program or erase operation as described above. That is, when the power is momentarily interrupted while the threshold voltage (Vt) of the memory cell increases from a negative (−) value to a positive (+)

value according to the movement of electrons or while the threshold voltage (Vt) of the memory cell decreases from a positive (+) value to a negative (−) value as shown in FIG. 3(a), the NAND flash memory device may not accurately recognize whether a program operation or an erase operation is being performed before the power is interrupted.

Figure 4:
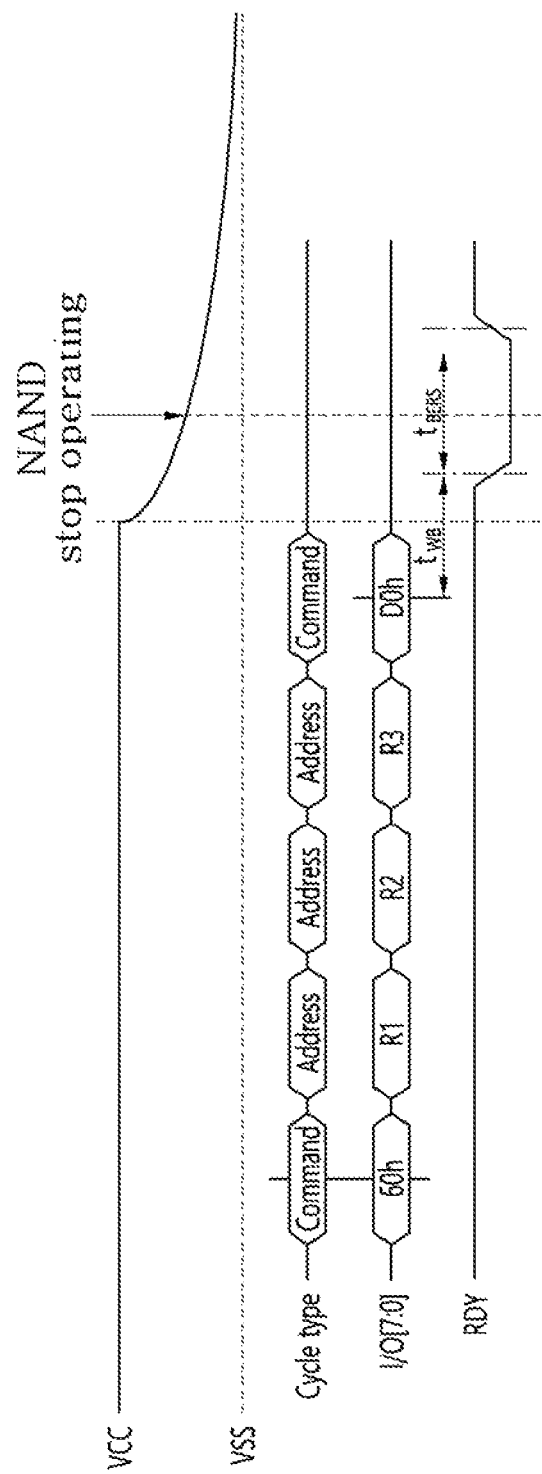
FIG. 4 is a view illustrating an erase operation of a NAND flash memory device.

FIG. 4 shows an embodiment in which an erase operation of a NAND flash memory device is shown in the order of time flow.

Referring to FIG. 4, the NAND flash memory device may perform an erase operation according to a control signal input from a controller (to be described later). The control signal may include a command signal and an address signal. In addition, VCC in FIG. 4 may mean a power supply voltage, and VSS may mean a ground voltage.

Accordingly, a cycle type of FIG. 4 indicates whether a command input in each cycle is a command or an address. For example, when the cycle type is a command, data currently input through a data bus indicates a command, and when the cycle type is an address, data currently input through the data bus indicates an address. In addition, I/O[7:0] indicates a data bus, and a ready (RDY) signal is a signal informing the controller whether the NAND flash memory device is ready or in use (eg, erase operation in progress), At the first time when this signal reaches the LOW level, the NAND flash memory device notifies the controller that the erase operation is currently in progress, and this is to inform the controller that the erase operation of the NAND flash memory device is currently in progress at a tBERS when this signal becomes the LOW level. That is, the NAND flash memory device maintains a high state of a pin transmitting the red (RDY) signal among a plurality of pins connected to the controller until it becomes a busy state for performing a specific operation, and may change to the low state at the point in time when the busy state is reached.

In this case, the erase operation of the NAND flash memory device as described above may be largely divided into three sections. The first section is a time for transferring a command and an address to the NAND flash memory device, and the second section means a time (tWB) required until the NAND flash memory device enters a busy state for performing a specific operation, and the third section means a time (tBERS) for erasing memory cells in block units.

In addition, the NAND flash memory device as described above operates based on a power supply voltage (eg, VCC). But, when the power supply voltage is reduced to a level at which the NAND flash memory device cannot normally perform, intermittent data corruption occurs.

That is, when the input voltage decreases below a certain level while the NAND flash memory device is performing a program or erase operation, the NAND flash memory device stops the operation and then resumes the program or erase operation when a normal voltage is input.

In this case, a non-volatile memory such as the NAND flash memory device generates a charge gain differently from a volatile memory when a power reset (or power supply interruption) is performed during the program or erase operation as described above. Here, the charge gain refers to a state in which the threshold voltage Vt of a cell is located in a marginal region that does not distinguish between '0' and '1'. Here, the marginal region means a region in which the threshold voltage Vt of the cell is between 0V and the reference threshold voltage RV. In this case, since the memory may perform an erroneous operation, the reliability of the product is greatly reduced.

Figure 5:
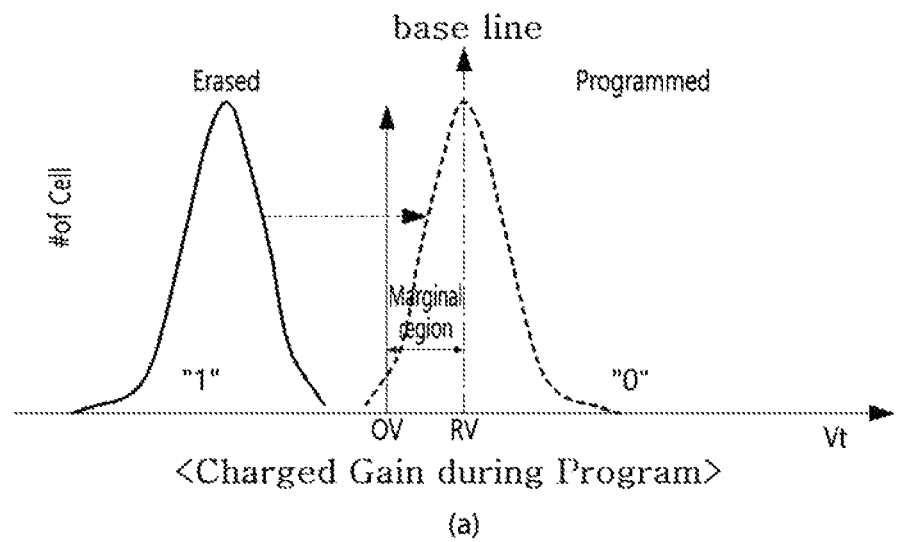
FIG. 5 is a view illustrating a charge gain in a NAND flash memory device.
Figure 5:
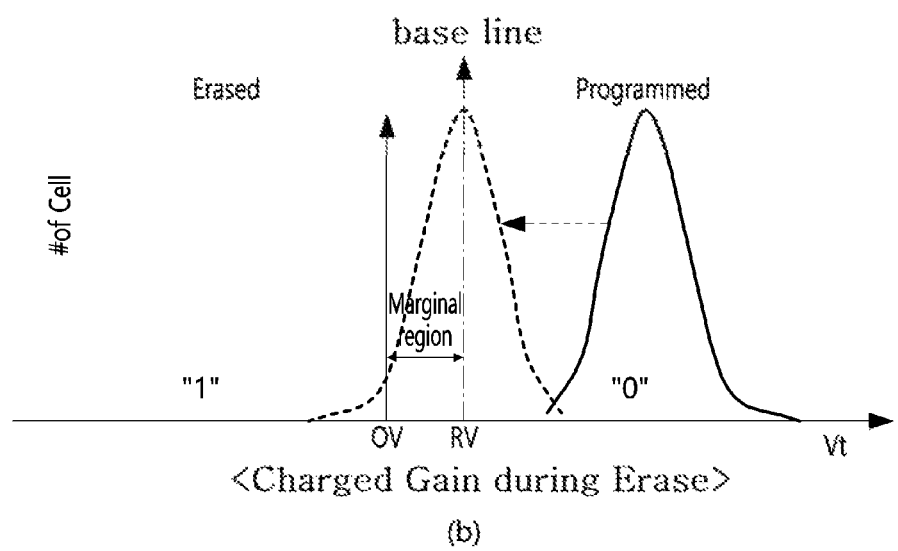

FIG. 5 is a view illustrating a charge gain in a NAND flash memory device. Referring to FIG. 5, the NAND flash memory device includes a charge gain generated during a program operation and a charge gain generated during an erase operation.

As shown in FIG. 5(a), the NAND flash memory device may perform a program operation according to a command of the controller. And, when the power is cut off while the electrons are moving by the program operation, the movement of the electrons is stopped when the power is cut off. Here, the threshold voltage Vt of the memory cell when the program operation is stopped may be located in a marginal region where '0' and '1' cannot be distinguished. And, when the threshold voltage Vt of the memory cell is located in the marginal region as described above, the controller (to be described later) cannot clearly determine whether the threshold voltage Vt of the memory cell is '0' or '1'. This may cause system failure.

As shown in FIG. 5(b), the NAND flash memory device may perform an erase operation according to a command of the controller. And, when the power is cut off while the electrons are moving by the erase operation, the movement of the electrons is stopped when the power is cut off. Here, the threshold voltage Vt of the memory cell at the point in time when the erase operation is stopped may be located in a marginal region in which '0' and '1' cannot be distinguished. And, when the threshold voltage Vt of the memory cell is located in the marginal region as described above, the controller (to be described later) cannot clearly determine whether the threshold voltage Vt of the memory cell is '0' or '1'. This may cause system failure.

Hereinafter, a NAND flash memory system according to an embodiment will be described.

Figure 6:
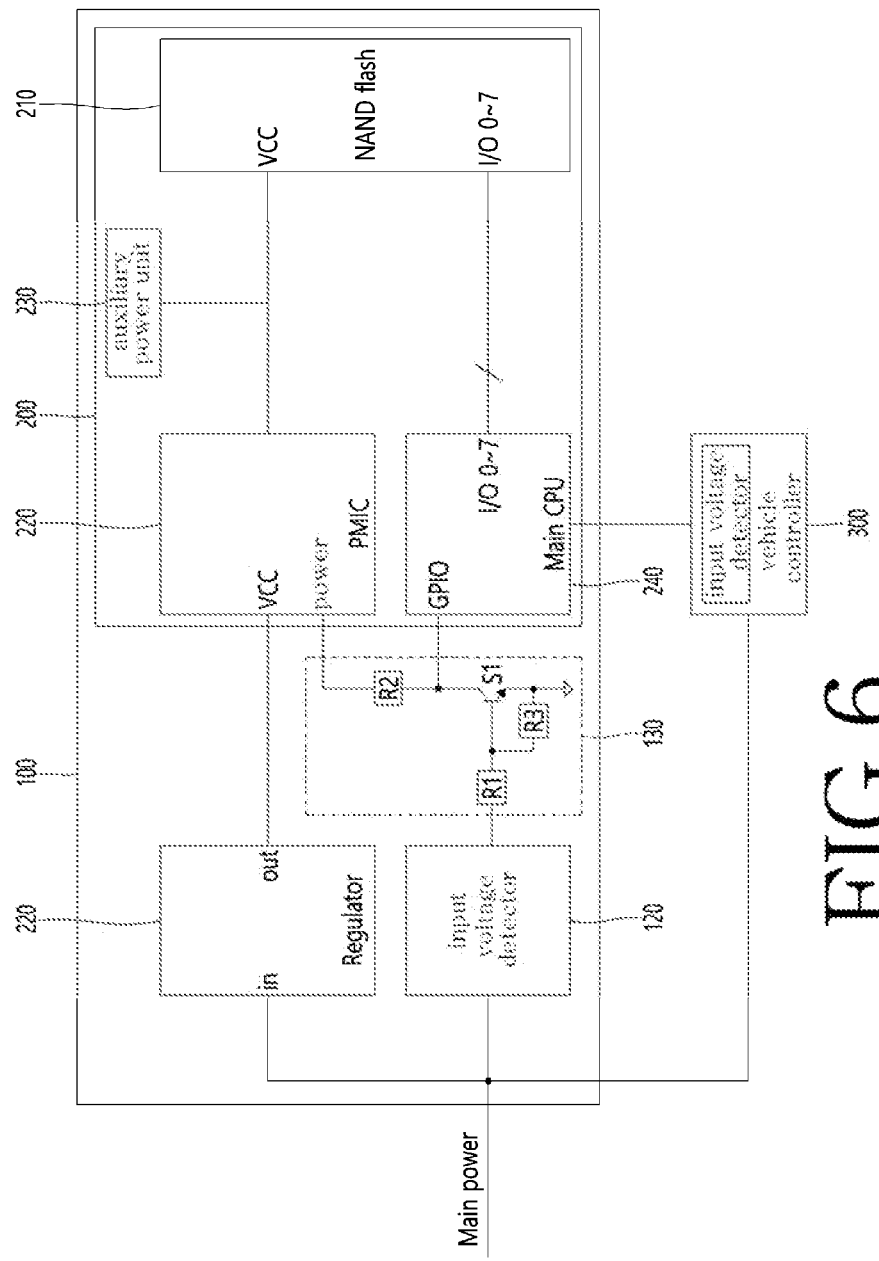
FIG. 6 is a block diagram illustrating an element of a NAND flash memory system according to a first embodiment.

FIG. 6 is a block diagram illustrating an element of a NAND flash memory system according to a first embodiment.

Referring to FIG. 6, the system 100 includes a power supply device and a control device 200. The power supply device may include a converter 110, an input voltage detector 120, and a detection signal transmitter 130.

The converter 110 of the power supply device may receive an input voltage corresponding to a main power, convert the input voltage into a voltage required by each element of the control device 200 and output the converted voltage.

In addition, the input voltage detector 120 of the power supply may detect the voltage of the main power and output a detected signal.

Also, the detection signal transmitter 130 of the power supply device may transmit an output signal of the input voltage detector 120 to the control device 200.

The control device 200 may include a storage device. The control device 200 may operate by using a voltage input from the power supply device as a driving voltage. The control device 200 may communicate with the vehicle controller 300 and store data transmitted from the vehicle controller 300. For example, the control device 200 may be provided in a vehicle to support an eCall function of the vehicle. That is, the control device 200 may communicate with the vehicle controller 300 to store information for reporting and requesting relief in an emergency situation. For example, the information may include accident occurrence location information, vehicle type information, driving direction information, a number of seat belts operated at the time of the accident, and the like.

The control device 200 may include a memory 210, a power supply unit 220, an auxiliary power unit 230, and a controller 240. In addition, the controller 240 of the control device 200 may control the memory 210. Preferably, the controller 240 may receive an operation signal (eg, a ready and busy output signal) from the memory 210, and access to the memory 210 based on the received operation signal. The operation signal may correspond to the timing of the NAND flash memory device constituting the memory 210. Here, the timing may be converted into a different time period according to an operation type of the device. For example, the different time period for each operation type includes a time tR (reading operation) for loading data from a memory cell (not shown) into a page register (not shown), a time tPROG (program operation) for loading data from a page register into a memory cell, a time tBERS (erase operation for erasing memory cells in block units and the like.

Also, the controller 240 of the control device 200 may control access to the memory 210 based on an output signal according to an input voltage operation transmitted from the power supply devices 110, 120, and 130.

Specifically, the controller 240 of the control device 200 may stop the operation of the memory under an unstable condition of the input voltage or a data protection condition of the memory 210 based on the output signal of the input voltage detector 120 of the power supply device transmitted from the power supply device 110, 120, 130. Here, stopping the operation of the memory 210 may mean stopping access to the memory 210, and furthermore, it may mean blocking the output of a command for controlling the operation of the memory 210. That is, the controller 240 of the control device 200 detects the unstable condition or the data protection condition of the input voltage while the protection function of the memory 210 is on, and based on this, the memory 210 operation can be stopped.

Hereinafter, the control device 200 and the power supply devices 110, 120, and 130 will be described in detail.

The power supply device may include a converter 110, an input voltage detector 120, and a detection signal transmitter 130. At this time, although each component of the power supply devices 110, 120, and 130 is illustrated as being configured separately from the control device 200 in the drawings, the embodiment is not limited thereto. That is, some of the elements constituting the power supply devices 110, 120, and 130 may be included in the control device 200.

The converter 110 may receive an input voltage and convert the input voltage to generate an output voltage.

The converter 110 may be implemented as a regulator. That is, the regulator may receive an input voltage through an input terminal and output an output voltage obtained by converting the input voltage through an output terminal. The voltage supplied to the control device 200 through the regulator may be a driving voltage of each element constituting the control device 200. For example, the voltage supplied to the control device 200 through the regulator may be a driving voltage of the memory 210. The regulator supplies a stable driving voltage to the control device 200 by stabilizing and outputting the input voltage so that the memory 210 constituting the control device 200 operates stably.

Meanwhile, the input voltage input to the converter 110 may be supplied from a power supply unit (not shown). For example, the power supply unit may be a battery of a vehicle in which the NAND flash memory system is installed.

The input voltage detector 120 may detect a level of the input voltage input through the power supply unit, and output a voltage detection signal according to the detection level.

In this case, the input voltage may have a first level V1 under a normal condition.

In addition, the input voltage detector 120 may output a first voltage detection signal when the input voltage has a level in a range between the first level V1 and a second level V2 smaller than the first level V1. In addition, the input voltage detector 120 may output a second voltage detection signal when the level of the input voltage is less than the second level V2 which is smaller than the first level V2. Here, the first voltage detection signal may be a low-level detection signal, and the second voltage detection signal may be a high-level detection signal, but is not limited thereto.

To this end, the input voltage detector 120 may include a comparator (not shown). The comparator may receive a reference signal corresponding to the second level V2 through a positive terminal, and may receive the input voltage through a negative terminal, and may output a high-level or low-level voltage detection signal according to a comparison result of the input voltage and the reference signal.

Meanwhile, the input voltage detector 120 may adjust a detection voltage through a voltage dividing resistor or the like. The voltage divider resistor divides the input voltage by a predetermined voltage division ratio and transmits it to the comparator.

The detection signal transmitter 130 may be connected to the control device 200, and thus may transmit a voltage detection signal detected through the input voltage detector 120 to the control device 200. Specifically, the detection signal transmitter 130 may be connected to the controller 240 of the control device 200, and may transmit a high signal or a low signal to the controller 240 based on the voltage detection signal.

To this end, the detection signal transmitter 130 may include first to third resistors R1, R2, and R3 and a transistor S1. The first to third resistors R1, R2, R3 and the transistor S1 may be a logic circuit that converts and outputs the high voltage of the voltage detection signal into a low voltage that can be received by the controller 240 of the control device 200. A detailed connection structure and operation thereof will be described as follows.

The first resistor R1 may have one end connected to an output terminal of the input voltage detector 120 and the other end connected to one end of the third resistor R3 and a base of the transistor S1.

The second resistor R2 may have one end connected to a power terminal of the power supply unit 220 of the control device 200 and the other end connected to a collector of the transistor S1 and a signal input terminal GPIO of the controller 240.

The third resistor R3 may have one end connected to the other end of the first resistor R1 and the base of the transistor S1, and the other end connected to a emitter of the transistor S1 and a ground terminal.

Transistor S1 may have the base connected to the output terminal of the input voltage detector 120 through the first resistor R1, the collector connected to the signal input terminal GPIO of the controller 240, and the emitter connected to the ground terminal.

The transistor S1 may receive the voltage detection signal of the input voltage detector 120 through the base.

Specifically, the transistor S1 may be turned on or off by the voltage detection signal of the input voltage detector 120 input to the base. For example, the voltage detection signal may be a high signal or a low signal as described above. In addition, the transistor S1 may be switched to an on state when a high signal is applied to the base, and accordingly, may output a second detection signal indicating voltage abnormality to the collector. Also, the transistor S1 may be switched to an off state when a low signal is applied to the base, and accordingly, may output a first detection signal indicating normal voltage, which is a high signal, to the collector terminal. Meanwhile, the transistor S1 is turned on by a high signal and turned off by a low signal in the embodiment, but the embodiment is not limited thereto and operations thereof may be interchanged.

The memory 210 may be a nonvolatile memory in which data can be programmed, erased and read. For example, the memory 210 may be a nonvolatile memory device that can be electrically programmed and erased, and does not require a refresh function to rewrite data at a predetermined period. Specifically, the memory 210 may be a NAND type flash memory device.

Since the memory 210 has been described in detail with reference to FIGS. 1 to 5, a detailed description thereof will be omitted herein.

The power supply unit 220 is connected to the output terminal (out) of the converter 110 to receive the output voltage of the converter 110, and stabilize the received output voltage to apply a driving voltage to the memory 210. That is, the power supply unit 220 may be a power management IC (PMIC) that supplies a driving voltage to the memory 210. The PMIC constituting the power supply unit 220 may be a power control module composed of a discrete power device module for power output, a high voltage power circuit, a low voltage digital circuit, and a high voltage and low voltage analog circuit, and accordingly, it can serve to convert, distribute, charge, and control the input voltage input to the control device 200 according to the memory 210.

An auxiliary power supply 230 may be disposed between the power supply unit 220 and the memory 210. The auxiliary power unit 230 may be a capacitor that performs a charging operation under a first condition and a discharging operation under a second condition. Here, the first condition may be a condition in which an input voltage of a normal range is input to the input terminal of the present system, and the second condition may be a condition in which a low voltage out of the normal range is input to the input terminal.

The auxiliary power unit 230 may supply a driving voltage to the memory 210 by discharging when the output voltage of the power supply unit 220 is lower than a preset second level V2 under a system power-on condition. At this time, the discharge time of the auxiliary power unit 230 is determined in proportion to the capacity of the capacitor constituting the auxiliary power unit 230. Accordingly, the capacity of the capacitor constituting the auxiliary power supply unit 230 in the embodiment may be determined in consideration of the time for loading data from memory cells of memory 210 into page registers, the time to load data from the page register into the memory cell, the time for erasing the memory cells in block units.

The controller 240 may control the operation of the memory 210.

Specifically, the controller 240 may access to the memory 210 to control a program operation, an erase operation, and a read operation of the memory 210.

To this end, the controller 240 may be connected to the memory 210 through a bus. In addition, the controller 240 may transmit a command and an address to the memory 210 through the bus, and may transmit and receive data.

Meanwhile, the controller 240 may monitor the output signal of the detection signal transmitter 130. That is, the controller 240 may monitor a change in the input voltage input to the system.

In addition, when the first detection signal notifying that the input voltage is normal is input through the detection signal transmitter 130, the controller 240 accesses to the memory 210 to perform a program operation or an erase operation.

At this time, when the second detection signal notifying an abnormality of the input voltage is input through the detection signal transmitter 130, the controller 240 blocks the output of the command to the memory 210 from a point in time when the second detection signal is input.

In other words, when the second detection signal is input through the detection signal transmitter 130, the controller 240 blocks the command output to stop access to the memory 210.

Then, the controller 240 ignores all commands related to the operation of the memory 210 from the time when the second detection signal is input, and blocks a command from being output to the memory 210 from a time point when the second detection signal is input.

In addition, the controller 240 and the memory 210 may be powered off after a predetermined time from the time point when the second detection signal is input. Here, the predetermined time may mean a time until the operation (program operation or erase operation) previously performed by the memory 210 is normally completed by the auxiliary power supplied through the auxiliary power supply unit 230.

The power-off of the memory 210 may be performed when the input voltage of the main power to the system decreases to a third level V3 corresponding to the power-off voltage of the memory 210. That is, when the input voltage of the main power decreases to the third level V3, the memory 210 may be naturally powered off due to insufficient power.

Also, even if the input voltage of the main power is restored to the first level V1 without decreasing to the third level V3, the memory 210 may be powered off. To this end, the vehicle controller 300 may turn off the power supply unit 220 of the control device 200 to power off the control device 200. Thereafter, the vehicle controller 300 may turn on the power supply unit 220 again to power on the control device 200.

However, the memory 210 in the embodiment may be a NAND flash memory device corresponding to a non-volatile memory. In this case, unlike RAM, which is a volatile memory, data stored in a NAND flash memory device is not erased even when the input power is cut off. Accordingly, the NAND flash memory device does not have to worry about internal data loss even when the input power is cut off, and for this reason, the auxiliary power does not need to be supplied even when the power is suddenly cut off. However, unlike the RAM, the NAND flash memory device distinguishes between '0' and '1' by comparing the threshold voltage Vt of the memory cell with the marginal region set based on the reference threshold voltage RV, as described in FIGS. 1 to 5.

Accordingly, if the memory 210 is in a program operation or an erase operation at the time the second detection signal is input, and the power-off sequence proceeds without completing the program operation or the erase operation, the program operation or the erase operation is continued at a later power recovery time.

However, as described above, when the threshold voltage Vt of the memory cell has a value in the marginal region (0V to the reference threshold voltage RV) at the time of power recovery, it is impossible to determine whether the value of the memory 210 is '0' or '1', and accordingly, the controller 240 may malfunction. Accordingly, when the time point at which the second detection signal is input is the program operation time (tPROG) or the erase operation time (tBERS) of the memory 210, the controller 240 may delay the power-off sequence until the program operation or the erase operation is completed. In other words, the controller 240 may supply auxiliary power to prevent the memory 210 from being powered off until the program operation or the erase operation currently being performed by the memory 210 is completed.

In addition, the memory 210 may be driven by the discharge voltage of the auxiliary power supply 230 under the data protection condition of the memory 210 as described above to complete the program operation or the erase operation. Also, when the program operation or the erase operation is completed, the memory 210 may transmit a completion signal thereof to the controller 240.

The controller 240 may recognize that the operation of the memory 210 has been completed, and may proceed with a power-off sequence of the memory 210.

The embodiment detects an unstable state of the input power and controls the operation of the NAND flash memory device based on this, and accordingly, it is possible to prevent defects such as data corruption that may occur when the NAND flash memory device operates in an unstable state of the input power. Specifically, according to the embodiment, the flash access is blocked when the input power is unstable, and accordingly, it is possible to prevent malfunction of the NAND flash memory device in an unstable environment of the input power.

In addition, when the operation of the NAND flash memory device in the embodiment is in progress at the time of power interruption detection, auxiliary power is supplied until the ongoing operation is completed, and accordingly, it is possible to solve data corruption due to charge gain that occurs when power is blocked during a program operation or an erase operation of the NAND flash memory device. Accordingly, the operation reliability of the NAND flash memory device may be improved.

In addition, a power-off sequence of the NAND flash memory device in the embodiment is performed when a power supply interruption is detected, and a power-on sequence is performed when a normal power supply is detected, and accordingly, operation reliability and user satisfaction can be improved as the flash memory normally operates when the input power is restored.

Meanwhile, the auxiliary power unit 230 in FIG. 6 has been described as being provided in the control device 200, but the auxiliary power supply unit 230 may be disposed in a location other than between the power supply unit 220 and the memory 210 in the control device 200.

Figure 7:
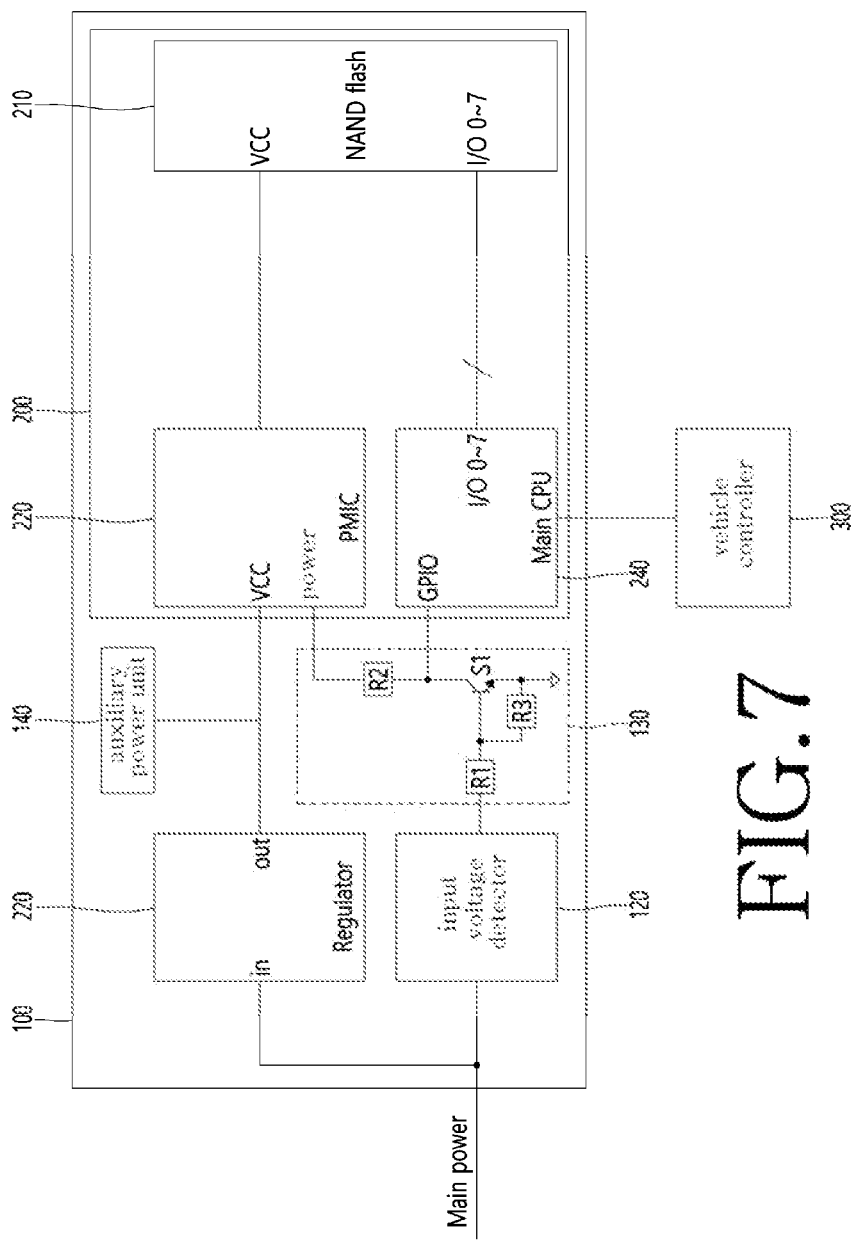
FIGS. 7 and 8 are views for explaining a modified example of the NAND flash memory system shown in FIG. 6.
Figure 8:
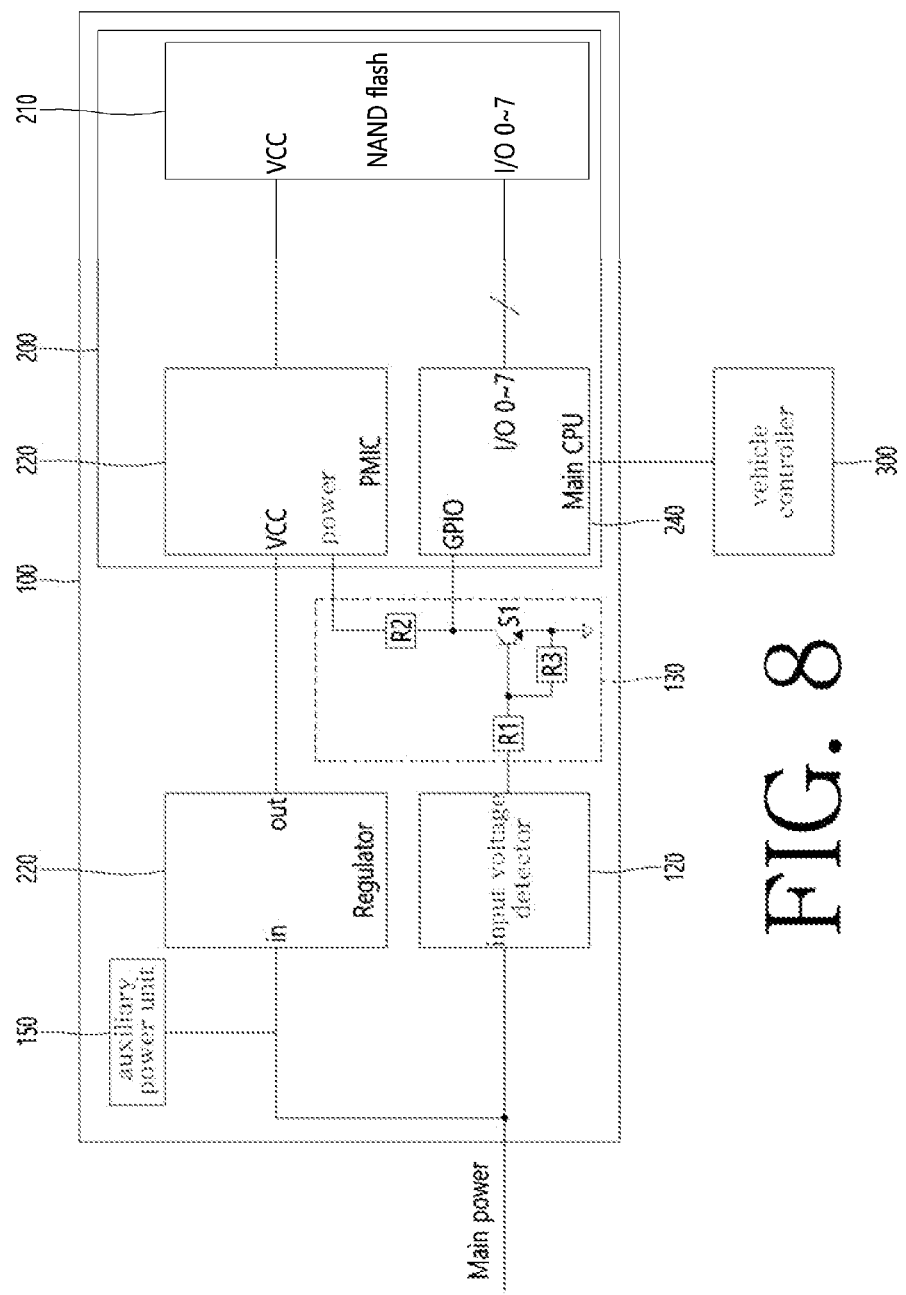

FIGS. 7 and 8 are views for explaining a modified example of the NAND flash memory system shown in FIG. 6.

Meanwhile, only the arrangement position of the auxiliary power unit of FIGS. 7 and 8 for supplying auxiliary power to the memory 210 when an abnormality occurs in the input voltage is different, and other features may be the same as in FIG. 6. Accordingly, only the auxiliary power supply unit will be described below.

Referring to FIG. 7, the NAND flash memory system may include a converter 110, an input voltage detector 120, a detection signal transmitter 130, a memory 210, a power supply unit 220, and a controller 240. In addition, the auxiliary power supply unit 140 is disposed between the output terminal of the converter 110 and the input terminal of the power supply unit 220. In addition, the auxiliary power unit 140 provides a discharge voltage to the power supply unit 220 when an abnormality occurs in the input voltage to the system, so that the driving voltage by the discharge voltage may be transferred to the memory 210.

In addition, referring to FIG. 8, the NAND flash memory system may include a converter 110, an input voltage detector 120, a detection signal transmitter 130, a memory 210, a power supply unit 220, and a controller 240. In addition, the auxiliary power supply unit 150 is disposed at the input terminal of the converter 110. In addition, the auxiliary power supply unit 150 provides a discharge voltage to the converter 110 at a time when an abnormality occurs in the input voltage to the system, so that the driving voltage may be transferred to the memory 210 by the discharge voltage.

Figure 9:
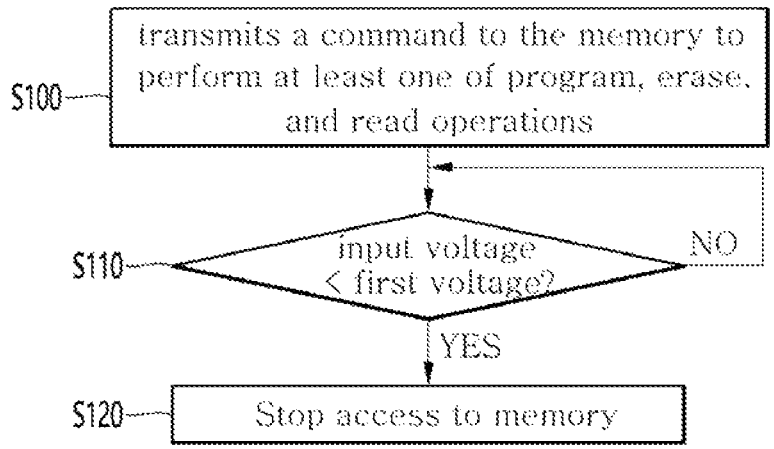
FIG. 9 is a view for explaining step by step a method of operating a NAND flash memory system according to an exemplary embodiment.

FIG. 9 is a view for explaining step by step a method of operating a NAND flash memory system according to an exemplary embodiment.

Referring to FIG. 9, the controller 240 may access to the memory 210 and transmit a command and an address to the memory 210 under a condition that an input voltage within a normal range is input. That is, the controller 240 transmits a command to the memory 210 under the normal condition so that at least one of a program operation, an erase operation (or an delete operation) and a read operation of the memory 210 may be performed (S100).

Thereafter, the controller 240 may check the voltage detection signal input through the signal input terminal GPIO in a polling or interrupt method. In addition, the controller 240 may determine whether a second detection signal indicating that an input voltage lower than the second level V2 is detected through the signal input terminal GPIO is received (S110).

In addition, when a second detection signal indicating that an input voltage lower than the second level V2 is detected is received, the controller 240 stops access to the memory 210 and blocks the output the command provided to the memory 210 (S120).

Figure 10:
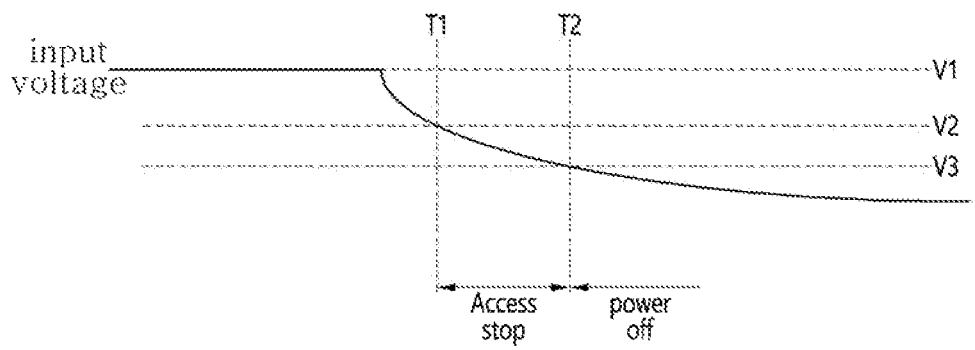
FIGS. 10 and 11 are views showing a power sequence according to a change in an input voltage.
Figure 11:
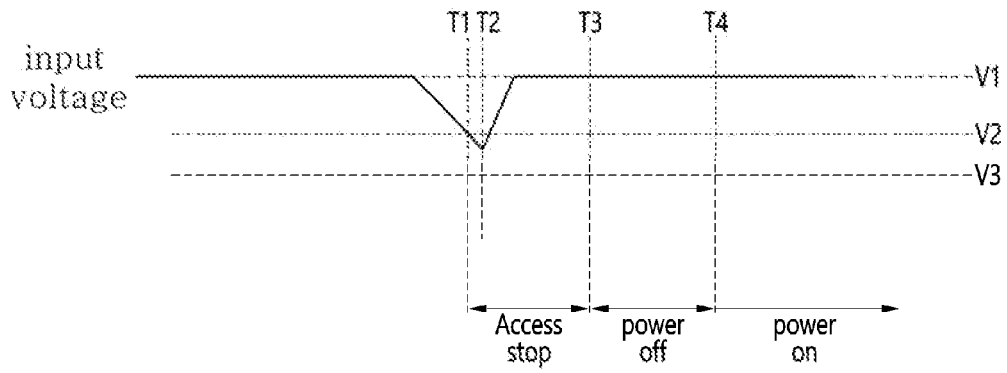

FIGS. 10 and 11 are views showing a power sequence according to a change in an input voltage.

Referring to FIG. 10, the input voltage may have a first level V1 under a normal condition. In addition, the input voltage detector 120 and the detection signal transmitter 130 may output a voltage abnormality detection signal when the input voltage decreases to the second level V2.

Accordingly, the controller 240 may stop to the access (ACCESS STOP) to the memory 210 at a first time point T1 at which the voltage abnormality detection signal is received.

Thereafter, the level of the input voltage may continue to decrease to a third level V3. Also, when the input voltage is reduced to the third level V3, the memory 210 may be powered off due to insufficient power.

Meanwhile, the power input to the system may be momentarily cut off as shown in FIG. 10, and the level of the input voltage may decrease to 0V.

However, unlike this, the power input to the system may be restored to a normal voltage level after being momentarily cut off.

That is, referring to FIG. 11, the input voltage may have a first level V1 under a normal condition. In addition, the input voltage detector 120 and the detection signal transmitter 130 may output a voltage abnormality detection signal when the input voltage decreases to the second level V2.

Accordingly, the controller 240 may stop the access (ACCESS STOP) to the memory 210 at the first time point T1 at which the voltage abnormality detection signal is received.

Thereafter, the input voltage may rise back to its normal level at a second time point T2.

At this time, even when the input voltage is restored to the first level V1, the controller 240 cannot normally control the memory 210 because the access stop operation has already been performed as described above. Accordingly, the vehicle controller 300 turns off the power supply unit 220 to power off the control device 200. To this end, the vehicle controller 300 may include an input voltage detector that detects an input voltage of the main power (refer to FIG. 6). Alternatively, the vehicle controller 300 may be connected to the input voltage detector 120 to monitor the input state of the main power. Also, the vehicle controller 300 may turn off the power supply unit 220 based on the input state of the main power.

And, when the input voltage maintains the first level V1 from the third time point T3 to a fourth time point T4 after a predetermined time, the vehicle controller 300 controls the power supply unit 220 may power on the power supply unit 220 to power on the control device 200.

Figure 12:
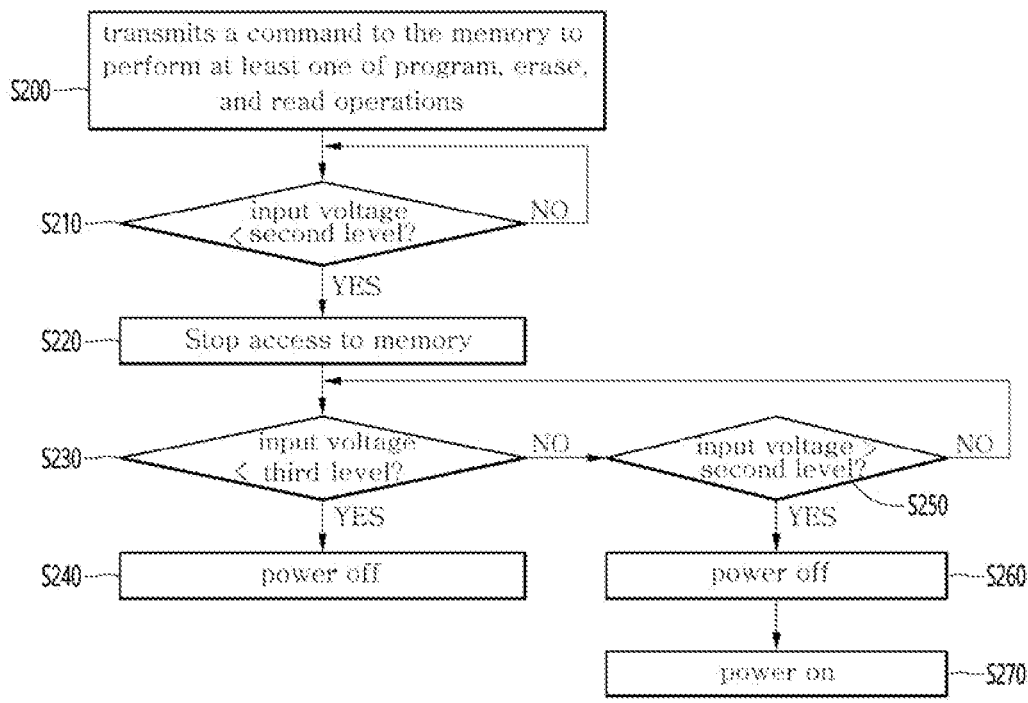
FIGS. 12 and 13 are flowcharts for explaining step-by-step a method of controlling a NAND flash memory system according to an embodiment.
Figure 13:
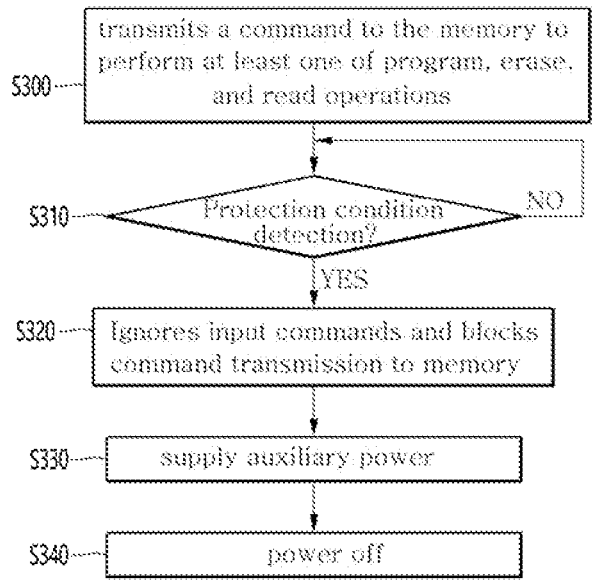

FIGS. 12 and 13 are flowcharts for explaining step-by-step a method of controlling a NAND flash memory system according to an embodiment.

Referring to FIG. 12, the controller 240 in the power sequence of the NAND flash memory system according to the embodiment accesses to the memory 210 under a condition that an input voltage within a normal range is input, and provides a command and an address to the memory 210. That is, the controller 240 transmits a command to the memory 210 under normal conditions so that at least one of a program operation, an erase operation (or a delete operation) and a read operation of the memory 210 may be performed (S200).

Thereafter, the controller 240 determines whether the input voltage is smaller than the second level (V2) based on the voltage detection signal (S210).

Then, when the input voltage decreases to less than the second level V2, the controller 240 stops the access to the memory 210 (S220).

Thereafter, the input voltage may decrease to less than a third level V3 that is smaller than the second level V2, and alternatively, the input voltage may be restored from the second level V2 to the first level V1 (S230, S250).

Also, when the input voltage decreases to the third level V3, the memory 210 may be powered off due to insufficient power.

Also, when the input voltage is restored from the second level V2 to the first level V1, the control device 200 may perform a reset operation (S260 and S270). Specifically, the vehicle controller 300 may power off the control device 200 by turning off the power supply 220 of the control device 200 for the reset operation of the control device 200 (S260). Thereafter, the vehicle controller 300 may turn on the power supply unit 220 again to power on the control device 200 (S270).

Meanwhile, referring to FIG. 13, the controller 240 in the power sequence of the NAND flash memory system according to the embodiment accesses to the memory 210 under a condition that an input voltage within a normal range is input, and provides a command and an address to the memory 210. That is, the controller 240 transmits a command to the memory 210 under normal conditions so that at least one of a program operation, an erase operation (or a delete operation) and a read operation of the memory 210 may be performed (S200)

Thereafter, the controller 240 determines whether a data protection condition of the memory 210 is detected (S310). That is, the controller 240 may determine whether the input voltage has decreased to less than the second level V2, which is lower than the first level V1.

And, when the input voltage decreases to less than the second level (V2) lower than the first level (V1), the controller 240 Ignores the input command and blocks the command from being transmitted to the memory 210 (S320).

In addition, the auxiliary power supply unit 230 supplies auxiliary power to the memory 210 so that the operation (program operation or erase operation) being performed in the memory 210 before detection of the protection condition can be normally completed. (S330).

Thereafter, the control device 200 may be powered off (S340). That is, when the input voltage continues to decrease to the third level V3, the control device 200 may be naturally powered off due to insufficient power. On the other hand, when the input voltage is restored to the first level V1 again, the vehicle controller 300 may reset the control device 200 by turning the power supply unit 210 of the control device 200 off and then on again.

As described above, the controller 240 in the embodiment performs a memory protection function when detecting power interruption. Here, the power supply interruption may occur by disconnection of the battery. And, when a change in input voltage occurs due to the separation of the battery as described above, the embodiment may perform the memory protection function as described above. However, an instantaneous change in the input voltage occurs even when the vehicle is started. And, when the memory protection function in an embodiment is performed by recognizing the vehicle start-on condition as an unstable condition of an input voltage or a data protection condition of the memory 210, the lifetime of the memory 210 may decrease.

That is, the lifetime of the memory 210 may decrease in proportion to the number of program operations and read operations. For example, the performance of the memory 210 may deteriorate in proportion to the number of program operations and read operations. And, generally, a program operation or a read operation is most performed when the memory is turned on or off. In this case, when the memory protection function as described above is operated when the vehicle is started on, the frequency of turning on or off the memory increases, and thus there is a problem in that the performance of the memory is deteriorated.

Accordingly, the memory protection function in the embodiment as described above is not operated when the vehicle is started. In other words, the input voltage unstable condition or the data protection condition of the memory does not include an input change condition that occurs when the vehicle is started on. In the embodiment, the memory protection function as described above is not performed when the vehicle is started, thereby minimizing the risk of deterioration of the memory.

In general, the battery is not removed or replaced in the ACC ON state. In addition, an unstable condition of an input voltage or a data protection condition of the memory in the embodiment may be detected when the battery is removed or replaced. In this case, the vehicle start-on is generally performed in the ACC ON state. Accordingly, the battery protection function in the embodiment is turned off in the ACC ON state.

Figure 14:
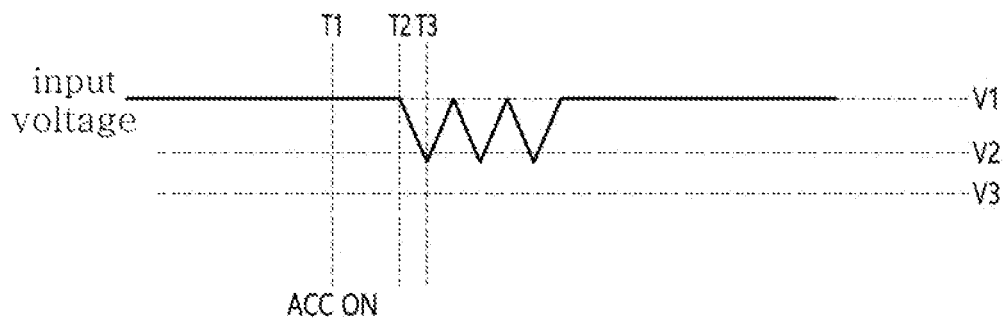
FIG. 14 is a view illustrating a change in an input voltage when a vehicle is started.

FIG. 14 is a view illustrating a change in an input voltage when a vehicle is started.

Referring to FIG. 14, when the vehicle is started, ACC ON is performed at a first time point T1. In this case, the input voltage may be the first level V1 described above. In addition, a start-on operation may be performed at the second time point T2 in the ACC ON state. In this case, the input voltage may decrease based on the second time point T2, and may decrease to a second level V2 smaller than the first level V1 at a third time point T3. In this case, the memory protection function in the embodiment operates when the input voltage decreases to the second level V2. However, as described above, the input voltage change when the ACC is on is for starting the engine on. Therefore, in the embodiment, the input voltage change in the ACC on state is ignored. For example, the memory protection function in the embodiment may operate in the ACC OFF state.

Figure 15:
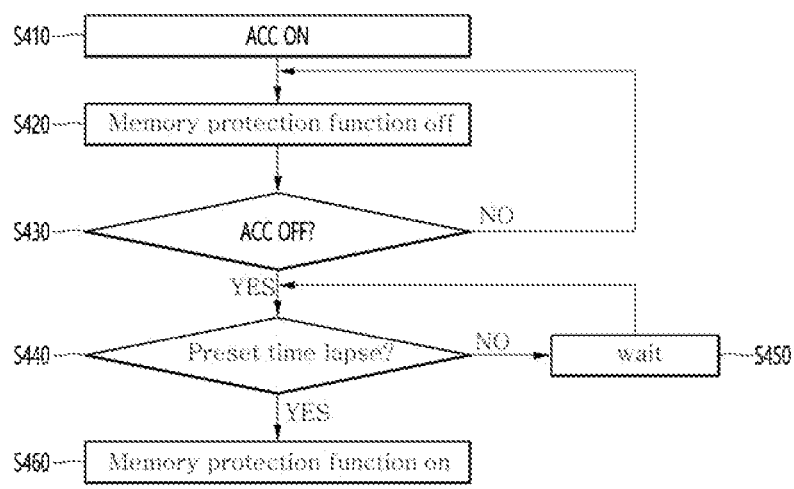
FIG. 15 is a flowchart for explaining step-by-step a method of activating a memory protection function according to an embodiment.

FIG. 15 is a flowchart for explaining step-by-step a method of activating a memory protection function according to an embodiment. Referring to FIG. 15, the controller 240 according to the embodiment may detect a power state of the vehicle. That is, the controller 240 may detect whether the vehicle's power state is an ACC ON state or an ACC OFF state. Then, when the vehicle's power state is the ACC ON state (S410), the controller 240 turns off the memory protection function (S420). In other words, when the power state of the vehicle is the ACC ON state (or the ignition-on state), the controller 240 in the embodiment turns off the memory protection function. Accordingly, the controller 240 ignores the change in the input voltage that occurs as the start-on operation is performed in the ACC ON state.

Subsequently, the controller 240 may determine whether the vehicle's power state is changed to the ACC OFF state (S430). That is, the controller 240 may determine whether the vehicle's ignition is OFF.

In addition, when the power state of the vehicle is changed to the ACC OFF state, the controller 240 determines whether a predetermined time has elapsed from the time when the ACC is changed to the ACC OFF state (S440). For example, the controller 240 may determine whether 1 sec has elapsed from the time when the power state of the vehicle is changed to ACC OFF.

And, if the predetermined time has not elapsed, the controller 240 may wait for a predetermined time (S450).

In addition, if a predetermined time has elapsed, the controller 240 turns on the memory protection function to operate the memory protection function according to a change in the input voltage (S460).

In other words, the memory protection function described with reference to FIGS. 9, 12, and 13 in the embodiment can be selectively operated only when the vehicle's power state is the ACC OFF state.

Accordingly, the embodiment may prevent the memory from being turned on or off even when the input voltage is changed when the vehicle is started, thereby improving the lifetime of the memory.

On the other hand, the reliability test of the function in the present embodiment was conducted by selecting samples for whether or not data corruption occurs before the function of this embodiment is applied to a NAND flash memory device of the same product and whether a malfunction occurs after the function of this embodiment is applied.

This is to (1) Test whether a malfunction occurs by shutting off the main power during the program or erase operation of the product before the function of this embodiment is applied, and (2) The same test was conducted to verify the effectiveness of the function of this embodiment after the function of this embodiment was applied to the same product.

As a result, in the case of Sample 1, it was confirmed that two malfunctions occurred when the power on/off operation was performed 1500 times and when the power on/off operation was performed 2900 times before the function of this embodiment was applied. However, it was confirmed that no malfunction occurred even when the power on/off operation was repeated 60,000 times or more after the function of the present embodiment was applied to Sample 1.

In addition, in the case of Sample 2, three malfunctions occurred at a time point when the power on/off operation was performed about 90 times, a time point of about 250 times, and a time point of about 1110 times of performing the power on/off operation before the function of this embodiment was applied. However, it was confirmed that no malfunction occurred even when the power on/off operation was repeated 60,000 times or more after the function of the present embodiment was applied to Sample 2.

Also, in the case of Sample 3, one malfunction occurred when the power on/off operation was performed about 370 times before the function of the present embodiment was applied. However, it was confirmed that no malfunction occurred even when the power on/off operation was repeated 60,000 times or more after the function of this embodiment was applied to Sample 3.

The embodiment detects an unstable state of the input power and controls the operation of the NAND flash memory device based on this, and accordingly, it is possible to prevent defects such as data corruption that may occur when the NAND flash memory device operates in an unstable state of the input power. Specifically, according to the embodiment, the flash access is blocked when the input power is unstable, and accordingly, it is possible to prevent malfunction of the NAND flash memory device in an unstable environment of the input power.

In addition, when the operation of the NAND flash memory device in the embodiment is in progress at the time of power interruption detection, auxiliary power is supplied until the ongoing operation is completed, and accordingly, it is possible to solve data corruption due to charge gain that occurs when power is blocked during a program operation or an erase operation of the NAND flash memory device. Accordingly, the operation reliability of the NAND flash memory device may be improved.

In addition, a power-off sequence of the NAND flash memory device in the embodiment is performed when a power supply interruption is detected, and a power-on sequence is performed when a normal power supply is detected, and accordingly, operation reliability and user satisfaction can be improved as the flash memory normally operates when the input power is restored.

What is claimed is:
1. A power supply device, comprising:
a memory;
a converter connected the memory and converting an input voltage of a supply power to supply an output voltage to the memory;
an input voltage detector connected to the converter and detecting a level of the input voltage;
a controller connected to the memory and controlling access to the memory based on the level of the input voltage; and an auxiliary power unit connected to the memory and the controller and supplying a driving voltage to the memory and the controller for a preset time, wherein the controller is configured to:
generate a command signal to program, read, and erase data in the memory when the level of the input voltage is greater than or equal to a first level,
control the auxiliary power unit so that the driving voltage for driving the memory and the controller is maintained for a first time period from a first time point at which the level of the input voltage becomes less than or equal to a second level,
block the command signal for the first time period, and block power from being supplied to the memory regardless of a level of the input voltage for at least a second time period from a second time point after the first time period has elapsed, and
wherein when the level of the input voltage is greater than or equal to the first level before the second time period elapses from the second time point, the controller blocks power from being supplied to the memory.

2. The power supply device of claim 1, wherein when the first time point is a program operation time (tPROG) or an erase operation time (tBERS) of the memory, the auxiliary power unit supplies the driving voltage for completing the program operation or erase operation of the memory.

3. The power supply device of claim 2, wherein when the first time point is in an electronic movement based on the program operation time (tPROG) or the erase operation time (tBERS) of the memory, the auxiliary power unit is configured to supply the driving voltage for completing the program operation or erase operation of the memory.

4. The power supply device of claim 1, wherein the first time period is a time until a program operation or an erase operation being performed in the memory before the first time point is completed.

5. The control apparatus of claim 1, further comprising:
a power management IC (PMIC) connected to the converter and supplying the driving voltage to the memory and the controller.

6. The control apparatus of claim 5, wherein the auxiliary power unit is disposed between the PMIC and the memory.

7. The power supply device of claim 5, wherein the controller is configured to control the PMIC so that power is supplied to the memory after the power supply is blocked for the at least second time period.

8. The power supply device of claim 5,
wherein the auxiliary power unit is connected to a power input terminal of the PMIC.

9. The power supply device of claim 8, wherein the input voltage detector is configured to detect a voltage level of an input terminal of the auxiliary power unit.

10. The power supply device of claim 8, further comprising:
a detection signal transmitter configured to transmit the voltage level detected through the input voltage detector to the controller.

11. The power supply device of claim 10, wherein the detection signal transmitter includes a first resistor, a second resistor, a third resistor, and a transistor.

12. The power supply device of claim 11, wherein one end of the first resistor is connected to an output terminal of the input voltage detector,
wherein the other end of the first resistor is connected to one end of the third resistor and a base of the transistor, wherein one end of the second resistor is connected to a power terminal of the supply power,
wherein the other end of the second resistor is connected to a collector of the transistor and a signal input terminal of the controller,
wherein one end of the third resistor is connected to the one end of the first resistor and the base of the transistor; and
wherein the other end of the third resistor is connected to an emitter and a ground terminal of the transistor.

13. The power supply device of claim 5, further comprising:
a regulator disposed between the supply power and the PMIC;
wherein the auxiliary power unit is disposed between the regulator and the PMIC.

14. The power supply device of claim 1, wherein the controller is configured to ignore a voltage change of the supply power in an ACC ON state.

15. The power supply device of claim 1, wherein when the level of the input voltage is greater than or equal to the first level for a third time period from a third time point after the second time has elapsed, the controller is configured to supply power to the memory.

16. The power supply device of claim 1, wherein when the level of the input voltage is greater than or equal to the first level while the driving voltage is maintained, the controller is configured to reset the memory.

17. The power supply device of claim 1, wherein when a predetermined time has elapsed from a point in time when ACC OFF is detected, the controller is configured to control an operation of the memory based on a change in the level of the input voltage.

18. A method for controlling a NAND flash memory device, comprising:
detecting a voltage level of a supply power;
when the voltage level is greater than or equal to a first level, generating a command signal to program, read, and erase data in the memory;
when the voltage level less than or equal to a second level, stopping access to the memory;
supplying a driving voltage by an auxiliary power unit for driving the memory for a first time period from a first time point at which the voltage level becomes less than or equal to the second level; and
blocking power from being supplied to the memory regardless of a voltage level of the supply power for at least a second time period from a second time point after the first time period has elapsed, and
wherein the stopping of the access comprises:
blocking a command signal for controlling the memory, and
wherein when the voltage level is greater than or equal to the first level before the second time period elapses from the second time point, the power supplied to the memory is blocked during the second time period.

19. The method of claim 18, wherein the supplying of the driving voltage comprises:
supplying the driving voltage for completion of a program operation or an erase operation of the memory when the first time point is the program operation time (tPROG) or the erase operation time (tBERS) of the memory.

20. The method of claim 19, wherein the first time period is a time until the program operation or the erase operation being performed in the memory before the first time point is completed.

* * * * *